United States Patent [19]
Kato et al.

[11] Patent Number: 5,752,609
[45] Date of Patent: May 19, 1998

[54] WAFER BOAT

[75] Inventors: Hitoshi Kato, Kitakami; Kouichi Takatsuki, Tokyo, both of Japan

[73] Assignee: Tokyo Electron Limited, Japan

[21] Appl. No.: 795,410

[22] Filed: Feb. 5, 1997

[30] Foreign Application Priority Data

Feb. 6, 1996 [JP] Japan ................ 8-044286

[51] Int. Cl.⁶ ................................ A47F 7/00
[52] U.S. Cl. ............... 211/41.18; 206/454; 118/500
[58] Field of Search ............... 211/41.18, 41.14, 211/41.2; 206/454; 432/121, 258; 118/500

[56]  References Cited

U.S. PATENT DOCUMENTS

| | | | |
|---|---|---|---|
| 4,653,636 | 3/1987 | Armstrong | 211/41.18 X |
| 4,872,554 | 10/1989 | Quernemoen | 206/454 |
| 5,219,079 | 6/1993 | Nakamura | 211/41.18 |
| 5,492,229 | 2/1996 | Tanaka et al. | 211/41.18 |
| 5,534,074 | 7/1996 | Koons | 211/41.18 X |
| 5,577,621 | 11/1996 | Yi | 211/41.18 |

*Primary Examiner*—Robert W. Gibson, Jr.
*Attorney, Agent, or Firm*—Graham & James LLP

[57]  ABSTRACT

A wafer boat includes a plurality of rods arranged substantially parallel to each other at regular intervals. A plurality of ring members are attached to the rods at regular intervals in a longitudinal direction of the rods. A plurality of supporting pieces are attached to each of the ring members. Each of the supporting pieces extends upward from an upper surface portion of each of the ring members and is bent radially inward of the ring member. The supporting pieces of each of the ring members are brought into contact with an edge portions of a lower surface of the wafer to support the wafer. Further, a plurality of convex portions are formed at inner peripheral edge portions of each of the ring members between each pair of adjacent ones of the rods, and extend radially inward of the ring member.

14 Claims, 10 Drawing Sheets

FIG. 13B COMPARATIVE

FIG. 14B EXAMPLE 1 (WITH NO TAPERED SURFACE)

FIG. 15B EXAMPLE 2 (WITH TAPERED SURFACE)

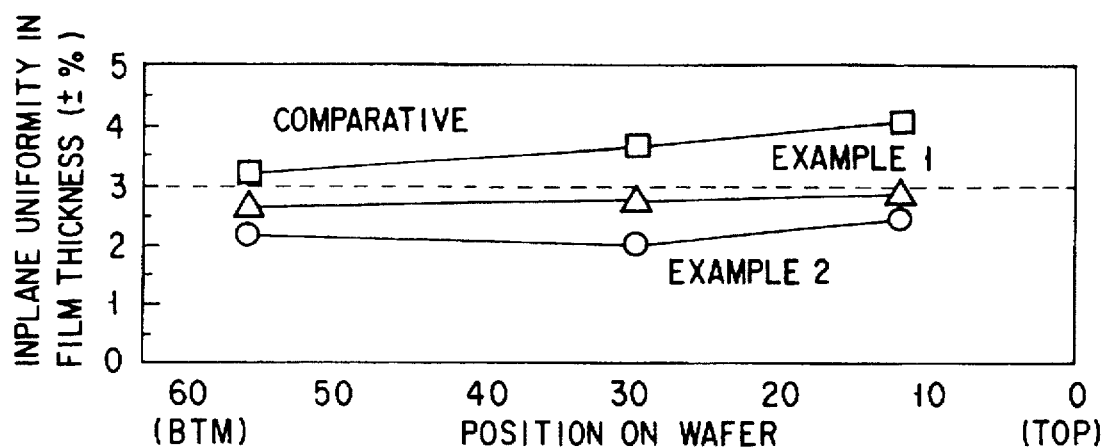
FIG. 16
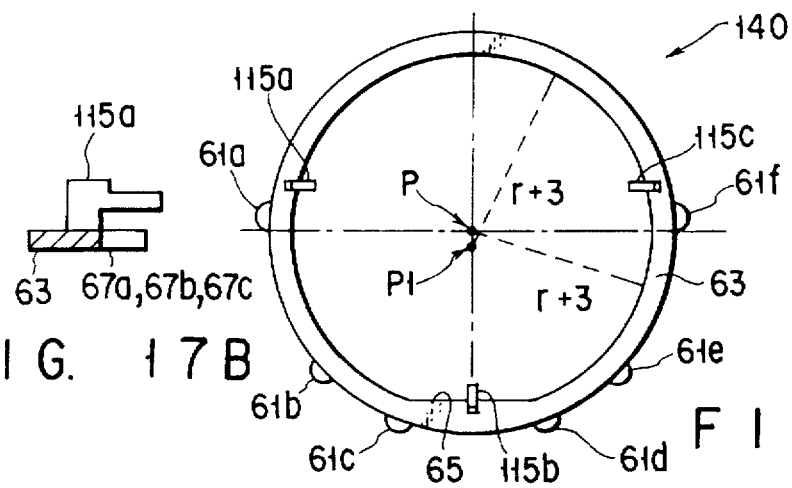
FIG. 17B
FIG. 17A
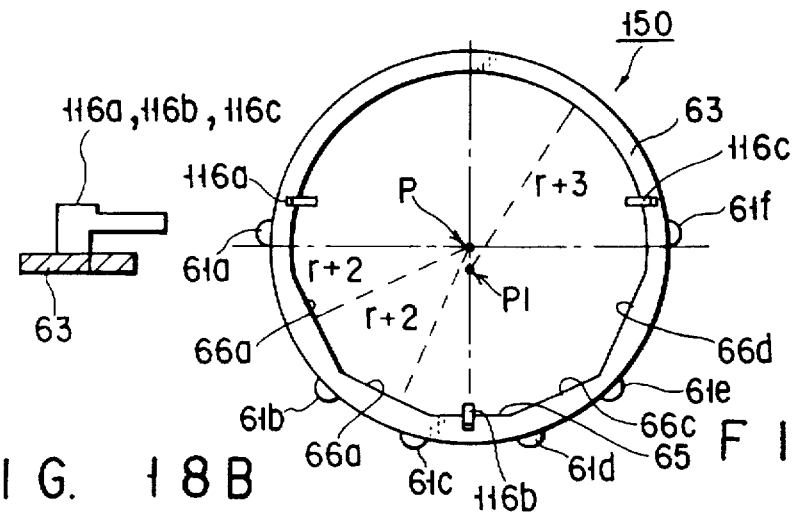
FIG. 18B
FIG. 18A

WAFER BOAT

BACKGROUND OF THE INVENTION

This invention relates to a wafer boat to be transferred into a longitudinal heat treatment furnace, with a plurality of semiconductor wafers held therein, and more particularly to a wafer boat to be used for a film forming treatment in a batch type longitudinal heat treatment furnace.

In general, to form a semiconductor integrated circuit, various treatments such as forming of a film on a semiconductor wafer, etching the film to provide a circuit pattern, etc. are repeatedly performed. In light of the fact that it can treat plenty of wafers, e.g. 150 wafers, at a time, a batch type longitudinal heat treatment furnace is often used for film forming. In the case of the batch type longitudinal heat treatment furnace, it is necessary to maintain at high level the inplane uniformity of the thickness of a film on a wafer in order to maintain in good conditions the electric characteristics of a semiconductor integrated circuit as a product.

Further, the semiconductor device tend to more refine in accordance with the development of high integration and densification techniques. In refining techniques of semiconductor devices, it is necessary to form a thin high-temperature oxide film having of a high compressive strength, which used as an oxide film, for example, a side wall of a control gate of a flash memory. Also in the oxide film of this type, further increase of uniformity of wafer-surface film thickness is demanded in accordance with the development of densification techniques.

As is shown in FIG. 1, in a generally known wafer boat 10, six quartz rods 2 each have their upper and lower ends fixed by holding plates 4 (only one of which is shown in FIG. 1), and plenty of wafer support recesses 6 are defined by inside portions of the rods 2 with a predetermined pitch in the longitudinal direction of the rods. A wafer W is placed in each wafer support recess, and then transferred into the longitudinal heat treatment surface together with the boat, where it is subjected to a predetermined heat treatment.

If, however, a high-temperature oxide film is formed on each wafer held in the wafer boat 10, the thickness of a center portion of the oxide film is usually thinner than a peripheral portion thereof. In these days, higher uniformity of wafer surface film thickness is required to follow the tendency of more and more development of refining techniques. The wafer boat 10 shown in FIG. 1 cannot satisfy such a demand.

To meet the requirement, U.S. Pat. No. 5,310,339, for example, discloses a wafer boat 20 provided with ring members and supporting pieces as wafer support means. The wafer boat 20 has a structure as shown in FIGS. 2 and 3. FIG. 3 shows a section as viewed from a direction indicated by the arrows A—A of FIG. 2. The structure of the wafer boat 20 differs from that of the wafer boat 10 shown in FIG. 1 wherein the wafer W is directly supported by the rods 2. The wafer boat 20 includes six rods 21, a pair of support plates 22 which support the upper and lower ends of each of the rods 21, and a plurality of ring members 23 of quartz arranged inside the rods 21 with a predetermined pitch in the longitudinal direction of the rods. A plurality (e.g. three) of supporting pieces 24 are provided on radially inner portions of the upper surface of each ring member 23 such that the pieces extend slightly radially inward of the ring member. The support pieces 24 are brought into direct contact with edge portions of the lower surface of each wafer W to support the same.

By virtue of the ring members 23, a wide space can be defined between the wafer W and the rods 21 in the wafer boat 20. As a result, the flow of gas over the wafer W is not greatly influenced by the rods 21, and further the ring members 23 serve to cause uniform flow of gas over the wafer W, thereby significantly enhancing the uniformity of wafer surface film thickness.

However, also in this case, the influence of the rods 21 and the supporting pieces 24 cannot completely be eliminated. For example, the concentration of the gas component is tend to be higher between the rods 21 than in the other areas. Since the gas flow is interrupted by the supporting pieces 24, those portions of a film which are formed in areas 31 between the rods 21 are tend to be thicker than those portions of the film which are formed in areas 32 in the vicinities of the supporting pieces 24. The requirement for further desification of semiconductor devices is now more and more increasing, and there is a limit in achieving, by the above-described wafer boat 20, further enhancement of inplane uniformity in film thickness to meet the requirement.

BRIEF SUMMARY OF THE INVENTION

It is the object of the invention to provide a wafer boat capable of enhancing the uniformity of wafer surface film thickness by minimizing the influence of rods or supporting pieces employed therein upon the flow of gas.

According to an aspect of the invention, there is provided a wafer boat for simultaneously supporting a plurality of semiconductor wafers, comprising: a plurality of rods arranged substantially parallel to each other at regular intervals; a plurality of ring members attached to the rods at regular intervals in a longitudinal direction of the rods, each of the ring members having a diameter larger than the diameter of a corresponding wafer; a plurality of supporting pieces attached to each of the ring members, each of the supporting pieces extending upward from an upper surface portion of each of the ring members and extending radially inward of the ring member, the supporting pieces of each of the ring members being brought into contact with an edge portions of a lower surface of the wafer to support the wafer; and a plurality of convex portions formed at inner peripheral edge portions of each of the ring members between each pair of adjacent ones of the rods, and extending radially inward of the ring member.

According to another aspect of the invention, there is provided a wafer boat for simultaneously supporting a plurality of semiconductor wafers, comprising: a plurality of rods arranged substantially parallel to each other at regular intervals; a plurality of ring members attached to the rods at regular intervals in a longitudinal direction of the rods, each of the ring members having a diameter larger than the diameter of a corresponding wafer; a plurality of supporting pieces attached to each of the ring members, each of the supporting pieces extending upward from an upper surface portion of each of the ring members and extending radially inward of the ring member, the supporting pieces of each of the ring members being brought into contact with an edge portions of a lower surface of the wafer to support the wafer; and a plurality of cutouts respectively formed in those portions of each of the ring members which are located below the supporting pieces.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13B is a partial sectional view, showing a supporting piece and its vicinity employed in the comparative wafer boat;

FIG. 14B a partial sectional view, showing the supporting piece and its vicinity employed in the wafer boat of the first embodiment;

FIG. 15B a partial sectional view, showing the supporting piece and its vicinity employed in the wafer boat of the second embodiment;

FIG. 16 is a graph, showing the results of experiments performed to confirm the effect of the invention;

FIG. 17A is a transverse sectional view, showing a wafer boat of a third embodiment;

FIG. 17B is a partial sectional view, showing a supporting piece and its vicinity employed in the wafer boat of the third embodiment;

FIG. 18A is a transverse sectional view, showing a wafer boat of a fourth embodiment; and FIG. 18B is a partial sectional view, showing a supporting piece and its vicinity employed in the wafer boat of the fourth embodiment.

DESCRIPTION OF THE INVENTION

The embodiments of the invention will be described in detail with reference to the accompanying drawings.

Figure 1:
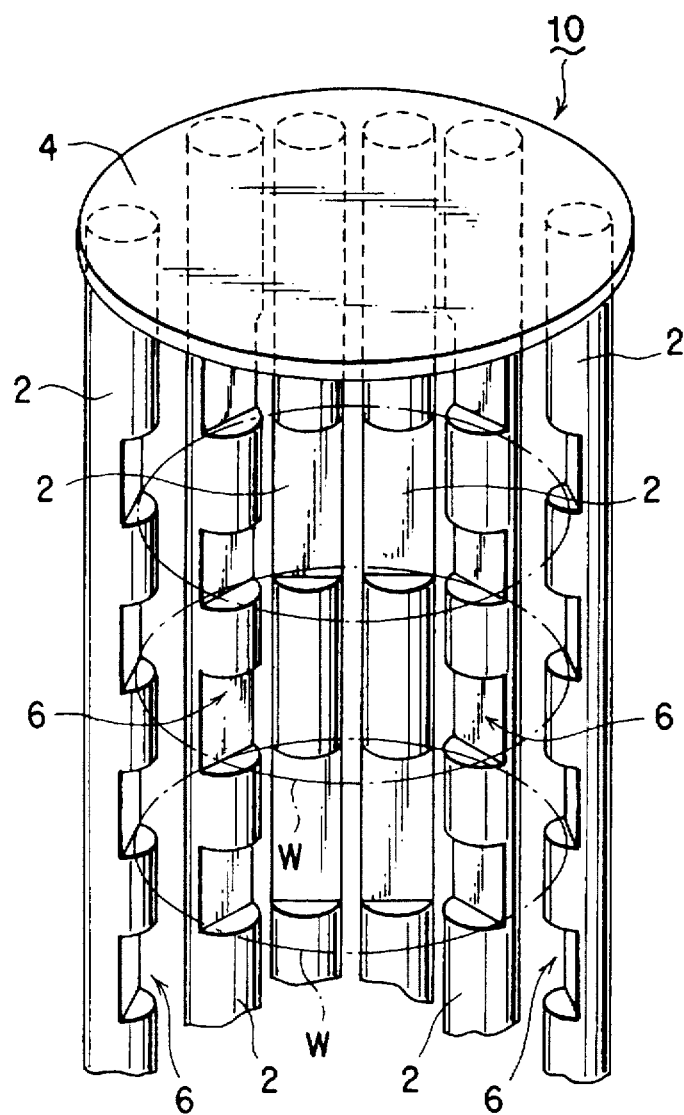
FIG. 1 is a perspective view, showing a conventional wafer boat.
Figure 2:
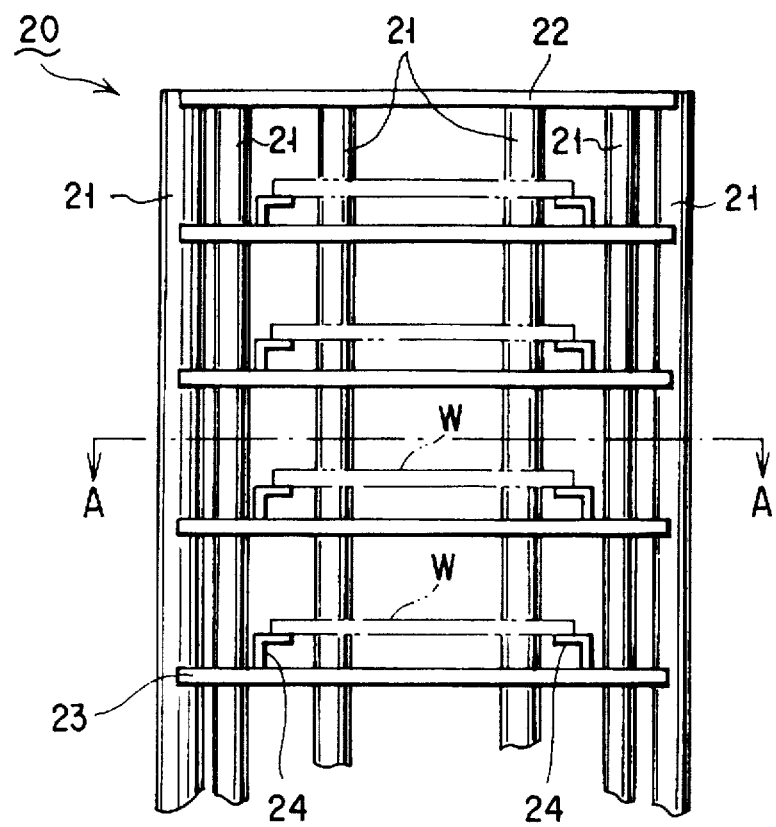
FIG. 2 is a front view, showing an essential part of the conventional wafer boat.
Figure 3:
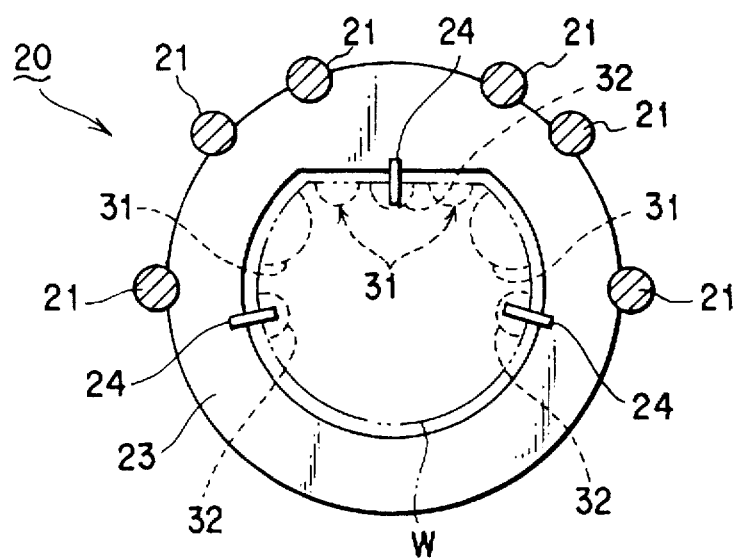
FIG. 3 is a transverse section, as viewed from a direction indicated by the arrows A of FIG. 2.
Figure 4:
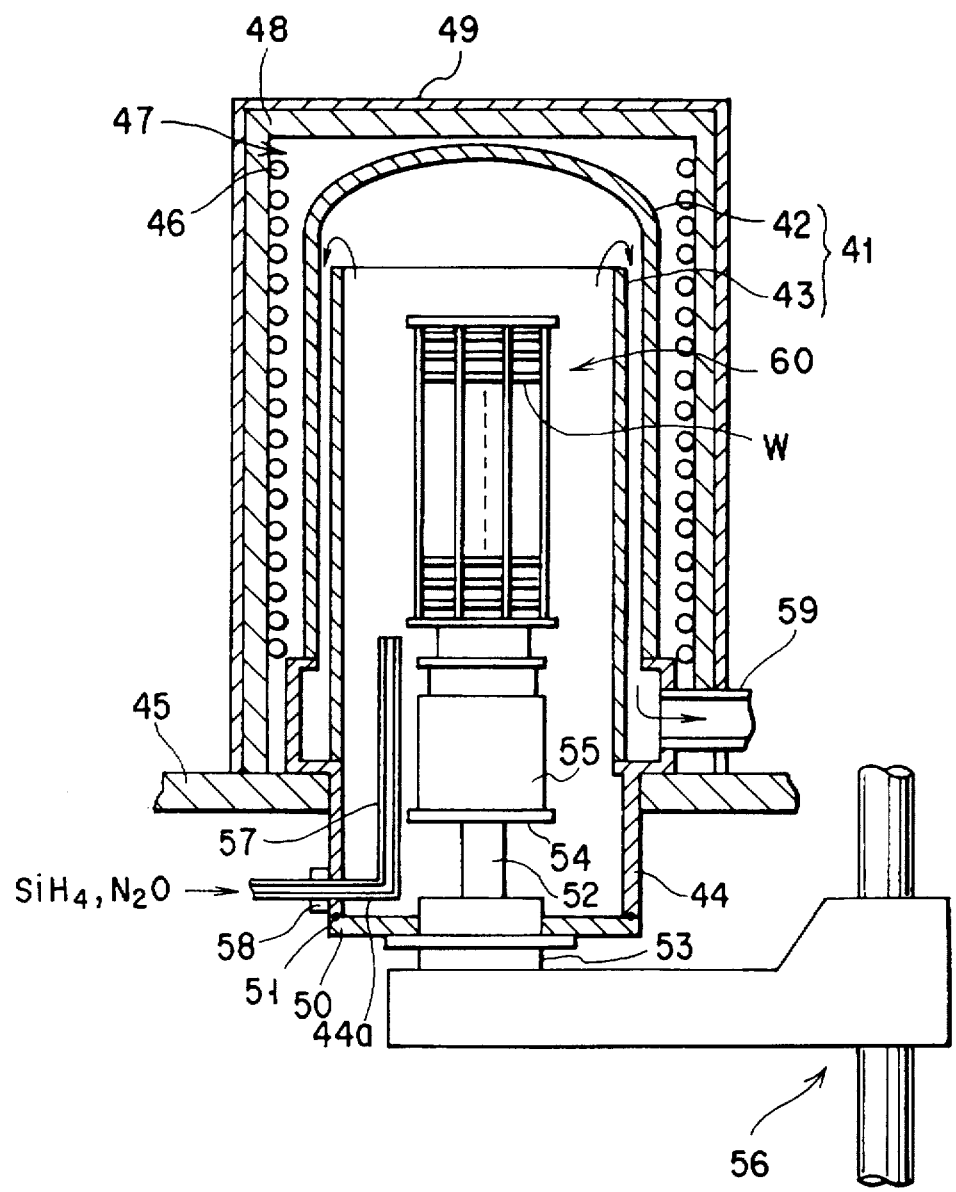
FIG. 4 is a schematic sectional view, showing a longitudinal heat treatment furnace with a wafer boat according to a first embodiment of the invention.

FIG. 4 is a longitudinal sectional view, showing a longitudinal heat treatment furnace with a wafer boat according to the invention. A longitudinal heat treatment furnace 40 comprises a cylindrical reaction tube 41 with its long axis arranged substantially vertical. The reaction tube 41 has a double-tube structure consisting of an outer tube 42 made of a heat resistive material such as quartz, and an inner tube 43 made of e.g. quartz and located within the outer tube 42. The outer and inner tubes 42 and 43 have their lower end portions held by a manifold 44 made of stainless steel, etc. The manifold 44 is fixed to a base plate 45.

A heater 46 formed of e.g. a resistive heat generator surrounds the reaction tube 41. The heater 46 and the reaction tube 41 constitute a heat treatment section 47. A heat insulating layer 48 formed of e.g. a silica block for warming the heat treatment section 47. Further, a cylindrical outer case 49 made of e.g. stainless steel encloses the heat insulating layer 48 for protecting the overall furnace.

The manifold 44 has a lower opening 44a sealed in an airtight manner by a disklike cap member 50 of e.g. stainless steel, with an elastic O-ring 51 interposed therebetween. A rotary shaft 52 is inserted through a substantially center portion of the cap member 50 such that the shaft is allowed to rotate in an airtight manner by means of e.g. a magnetic fluid seal. The rotary shaft 52 has a lower end coupled with a rotary mechanism 53. A turn table 54 made of e.g. stainless steel is fixed to the upper end of the rotary shaft 52. A heat insulating cylinder 55 made of e.g. quartz is provided on the turn table 54, and a wafer boat 60 according to the invention is placed on the heat insulating cylinder 55.

The wafer boat 60, the heat insulating cylinder 55, the turn table 54 and the cap member 50 are integrally transferred into and out of the reaction tube 41 by a boat elevator 56 as a vertical movement mechanism.

An L-shaped process gas introducing pipe 57 made of e.g. quartz, which is bent upward, i.e. toward the wafer boat 60, is inserted through a lower portion of the manifold 44 in an airtight manner with a seal member 58 attached thereto. Through the pipe 57, a process gas for forming a film, such as $SiH_4$ or $N_2O$ gas, can be introduced into a lower portion of the inner cylinder 43, with its flow rate controlled.

An exhaustion pipe 59 made of e.g. stainless steel and connected to a vacuum pump (not shown) is inserted through a lower side portion of the manifold 44 for discharging, to the outside of the reaction tube 41, the process gas having been used and flowing down in a clearance defined between the inner and outer tubes 43 and 42.

The wafer boat 60 according to a first embodiment of the invention, which is to be received in the reaction tube 41 of the longitudinal heat treatment furnace 40 constructed as above, will now be described.

Figure 5:
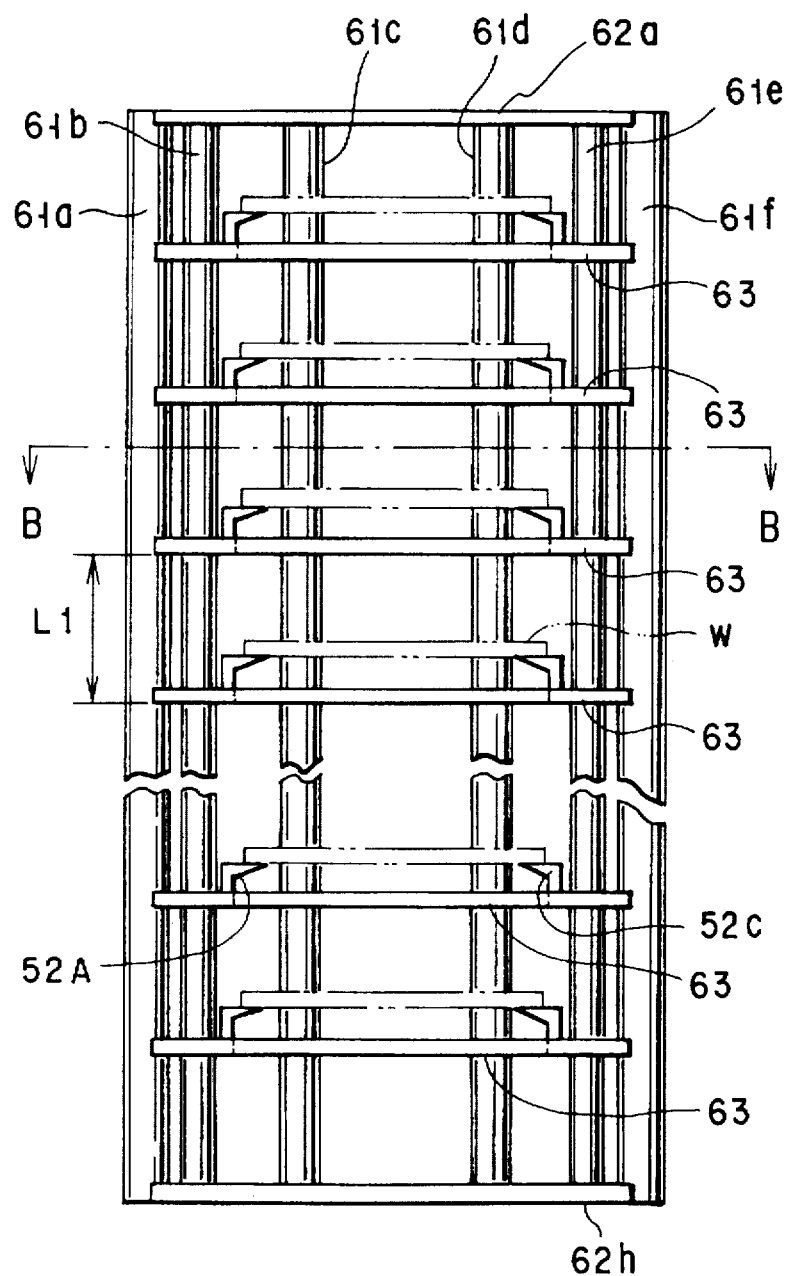
FIG. 5 is a front view, showing the wafer boat according to the first embodiment of the invention.
Figure 6:
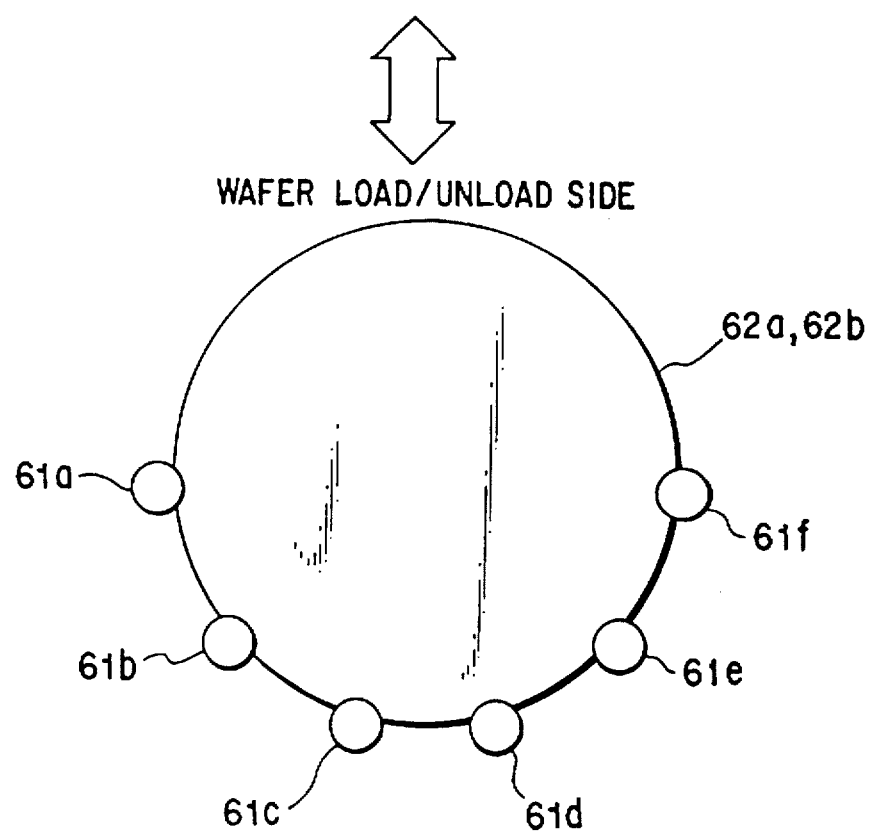
FIG. 6 is a plan view, showing the wafer boat according to the first embodiment of the invention.

The wafer boat 60 is made of a heat resistive material such as quartz. As is shown in FIG. 5, the wafer boat 60 has a plurality (e.g. six) of rods 61a to 61f. Each rod has its upper and lower ends held by substantially disklike holding plates 62a and 62b. The rods 61a to 61f are arranged substantially parallel to each other. Further, as is shown in FIG. 6, the rods 61a to 61f are arranged at substantially regular intervals on half a circumferential portion of each of the holding plates 62a and 62b. However, it is not always necessary to arrange the rods at regular intervals. A wafer W is transferred over the other half circumferential portion on which no rods are arranged (hereinafter referred to as a "wafer load/unload side portion").

As is shown in FIG. 5, a plurality of ring members 63 are provided on the rods 61a to 61f in the longitudinal direction with a predetermined distance L1 interposed between each pair of adjacent rods. In the case of an 8-inch wafer, the distance L1 is set to about 15 mm, and the total number of the ring members 63 provided in the wafer boat is, for example, 60. Moreover, the outer diameter of the ring member 63 is set larger than the diameter of the wafer W.

Figure 7:
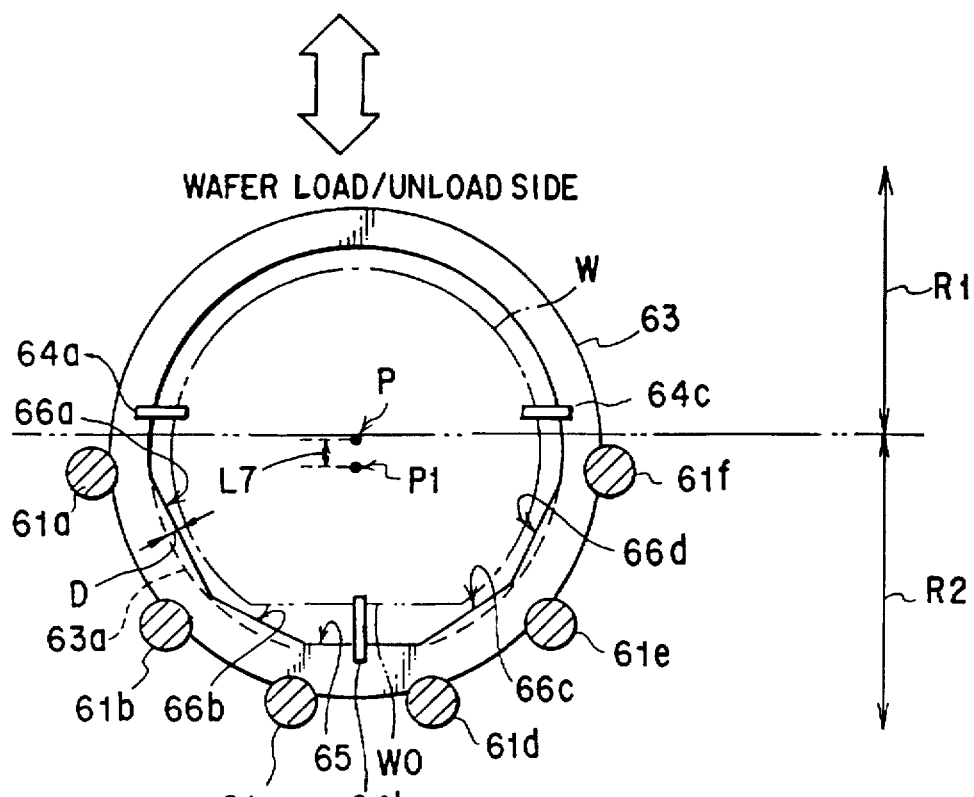
FIG. 7 is a transverse section, as viewed from a direction indicated by the arrows B of FIG. 5.

As is shown in FIG. 7, a plurality (e.g. three) of supporting pieces 64a to 64c are attached to upper surface portions of each ring member 63. The supporting pieces 64a to 64c extend slightly upward from the ring member 63 and slightly radially inward of the same. The tips of the supporting pieces 64a to 64c are brought into direct contact with edge portions of the lower surface of the wafer W to thereby support the wafer W.

The three supporting pieces 64a to 64c are arranged as follows: Two supporting pieces 64a and 64c are attached to those portions of the ring member 63 which are respectively slightly closer to the wafer load/unload side than the two rods 61a and 61f arranged in a substantially diametrical direction, while the remaining supporting piece 64b is attached to that intermediate portion of the ring member which is located between the middle two rods 61c and 61d.

Figure 9:
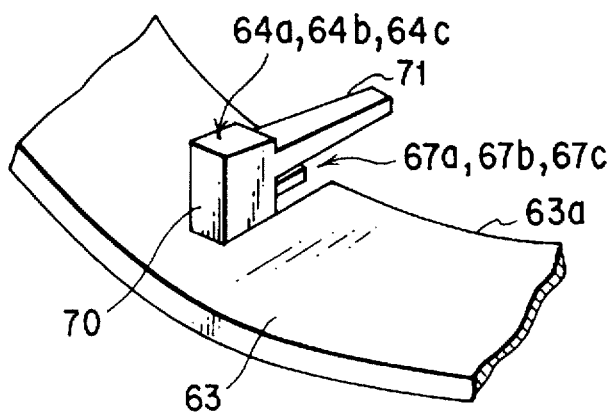
FIG. 9 is an enlarged perspective view, showing a supporting piece employed in the wafer boat of the first embodiment.

As is shown in FIG. 9, each of the supporting pieces 64a to 64c includes a rod portion 70 substantially vertically standing on the surface of the ring member 63, and a projection projecting from the rod portion 70 radially inward of the ring member 63.

In the first embodiment, the inner diameter of the ring member 63 is set slightly larger, by e.g. several millimeters, than the outer diameter of the wafer W. However, the inner diameter of the ring member 63 may be set equal to or smaller than the outer diameter of the wafer W.

The ring member 63 has a linear inner edge portion 65 to be opposed to the orientation flat (hereinafter referred to as "O.F.") WO of the wafer W. In the first embodiment, the wafer W is supported by the ring member 63 such that its O.F.WO is situated remote from the wafer load/unload side as shown in FIG. 7. In other words, the wafer W is transferred into the wafer boat 60, with its O.F.WO directed forward.

Convex portions 66a to 66d for restraining gas flow are provided between each pair of the adjacent rods 61a to 61f, i.e. between 61 and 61b, between 61b and 61c, between 61d and 61e, and between 61e and 61f, respectively. The convex portions 66a to 66d project radially inward of the ring member 63 from that inner peripheral edge 63a of the ring member 63 which is defined when the convex portions are not formed (hereinafter referred to as a "basic line"). The convex portions 66a to 66d are formed such that they constitute linear inner edge portions, i.e. inner chord portions of the ring member 63. In other words, the convex portions 66a to 66d each constitute a segment which is defined by an arc connecting two point between each pair of the adjacent rods 61a to 61f, and a chord connecting the each two point. However, the shape of the convex portions is not limited to this. Whatever shape they have, it suffices if they function to restrict the flow of the process gas between the inner peripheral edge of the ring member 63 and the peripheral edge of the wafer W.

In the embodiment, the linear portion 65 between the rods 61c and 61d serves also as a gas flow restraining convex portion.

By virtue of the convex portions 61a to 61f and the linear portion 65, the flow rate of the process gas passing between the convex portions and the wafer W can be restricted.

It is preferable that the radial projection amount D of each convex portion 61a to 61f is 0.25 to 1.5 mm in the case of a 6-inch wafer, 0.5 to 2 mm in the case of an 8-inch wafer, and 0.5 to 3 mm in the case of a 12-inch wafer. This is because if the projection amount is too small, a sufficient gas flow restraining effect cannot be obtained, while if the projection amount is too large, the gas flow is too restricted, which may well result in degradation of uniformity of wafer surface film thickness.

Figures 8A, 8B:
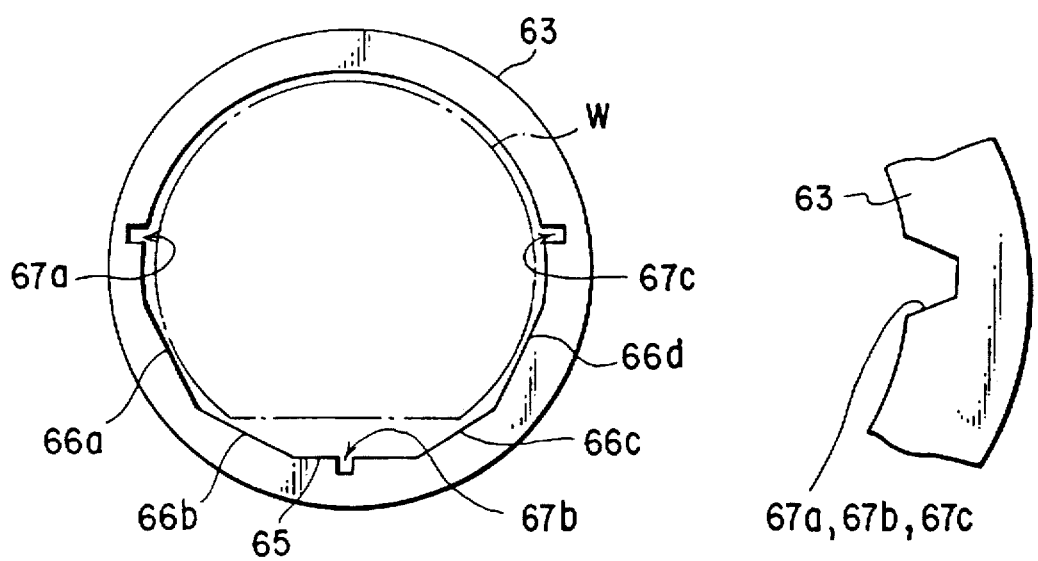
FIG. 8A is a plan view, showing a ring member employed in the wafer boat of the first embodiment.
FIG. 8B is a view, useful in explaining a modification of the ring member shown in FIG. 8A.

As is shown in FIGS. 8A and 9, cutouts 67a to 67c are formed in those inner peripheral edge portions of the ring member 63 which are located below the supporting pieces 64a to 64c. The cutouts 67a to 67c have, for example, a substantially square shape having each side of several millimeters. The cutouts 67a to 67c can increase the flow rate of the process gas in the vicinity of the supporting pieces 64a to 64c.

The cutouts 67a to 67c may have a trapezoidal shape with its width increased radially inward of the ring member 63, as shown in FIG. 8B.

Figure 10B:
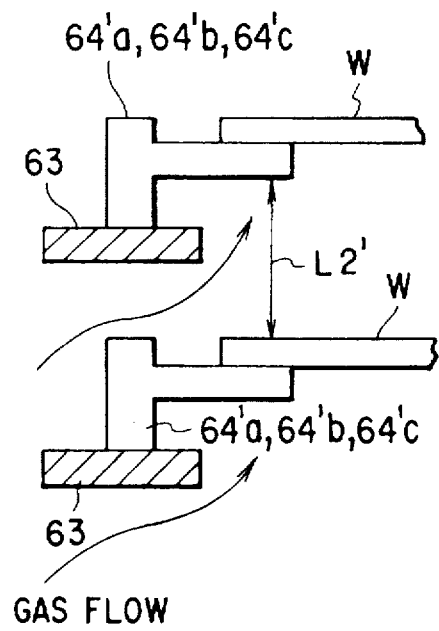
FIG. 10B is a view, showing a state in which a wafer is held by the supporting piece of the conventional wafer boat.
Figure 10A:
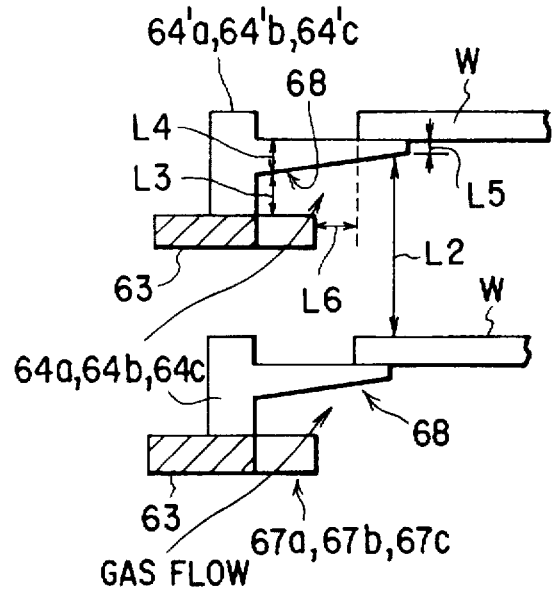
FIG. 10A is a view, showing a state in which a wafer is held by the supporting piece of the wafer boat of the first embodiment.

Furthermore, in the wafer boat 60 of the first embodiment, each of the supporting pieces 64a to 64c has a tapered lower surface 68 extending upward from the outside to the inside of the ring member 63 as shown in FIG. 10A. This tapered surface 68 slightly increases the distance L2 between each pair of the adjacent wafers W vertically arranged, thereby facilitating the flow of the process gas between the wafers W, as compared with the distance L2' between the wafer W and each of supporting pieces 64'a to 64'c with no tapered surfaces as shown in FIG. 10B. In the FIG. 10A case, the thickness L4 of a proximal end portion of each supporting piece 64a to 64c is set to about 2 mm, while the thickness L5 of a distal end portion of the same is set to e.g. about 1 mm, which is a minimum value for holding the wafer W. Thus, the distance L2 in FIG. 10A is larger by about 1 mm than the distance L2' in FIG. 10B.

It is also preferable to set the height L3 of the supporting pieces 64a to 64c to a value which enables a transfer arm (not shown) to be taken into and out of a clearance between the ring member 63 and the supporting pieces 64a to 64c. Specifically, the height L3 is set to about 3 to 4 mm. In the embodiment, the distance L6 between the inner peripheral edge of the ring member 63 and the peripheral edge of the wafer W is set to about 1 to 3 mm, depending upon the position in which the wafer W is placed.

In addition, as is shown in FIG. 7, in the wafer boat 60 of the first embodiment, it is preferable that a clearance between an inner peripheral edge of ring member 63 and a peripheral edge of wafer W of a semicircular portion R1 of the wafer W, is differ from that of a semicircular portion R2 of the wafer; the semicircular portion R1 is a half portion of the ring member 63 which is situated close to the wafer load/unload side, and the semicircular portion R2 is a half portion of the ring member 63 which is situated remote from the wafer load/unload side. Thus, it is preferable that a center p1 of the inner peripheral edge of the semicircular portion R7 is displaced by a distance L7, e.g., several millimeters, from a center p of wafer W in a direction away from the wafer load/unload side, so that a clearance between wafer W and the ring portion 63 in the semicircular portion R2 is larger than that in the semicircular portion R1

This is because it is necessary to compensate the amount of the process gas flowing over the semicircular portion R2 since the flow of the process gas is more restricted on the side of the semicircular portion R2 than on the side of the other semicircular portion R1, by the rods 61a to 61f and the supporting pieces 64a to 64c provided on that portion of the ring member 63 which is situated on the side of the semicircular portion R2 of the wafer W.

A film-forming process will be described, which is performed in the longitudinal heat treatment furnace 40 equipped with the wafer boat 60 of the first embodiment constructed as above. In this film-forming process, a high-temperature oxide film is formed on the wafer W.

First, the wafer boat 60 with plenty of wafers W not yet treated is transferred into the reaction tube 41 which has been moved upward by the boat elevator 56. At this time, the lower opening 44a of the manifold 44 is sealed in an airtight manner by the cap member 50, thereby sealing the reaction tube 41 in an airtight manner.

Subsequently, the pressure in the reaction tube 41 is reduced to a predetermined vacuum value, and at the same time, the heater 46 is excited to heat the wafers W to a predetermined treatment temperature and keep them at the temperature. Then, the process gas for film forming having its flow rate controlled is introduced into the wafer boat 60 from that outlet of the process gas introducing pipe 57 which is located below the wafer boat 60. While flowing upward in the inner cylinder 43, the process gas flows between the wafers W. Although the amount of the process gas flowing between the rods 61a and 61b, between the rods 61b and 61c, between the rods 61c and 61d, between the rods 61d and 61e and between the rods 61e and 61f is slightly greater than in the other portions, the convex portions 66a to 66d and the linear portion 65 provided at the inner peripheral edge of the ring member 63 between the rods 61a to 61f restrict the amount of the process gas flowing there, with the result that the flow rate of the process gas between each pair of the adjacent rods 61a to 61f is substantially equal to that of the process gas in any other portion. Accordingly, the thickness of the high-temperature oxide film can be made uniform between areas of the wafer W corresponding to the rods 61a to 61f and the other areas.

On the other hand, in the vicinities of the supporting pieces 64a to 64c, the flow of the process gas is interrupted by the supporting pieces 64a to 64c, respectively, which means that the flow rate of the process gas there is more restricted than in other areas. Since, however, the ring member 63 has the cutouts 67a to 67c formed in portions thereof corresponding to the supporting pieces 64a to 64c as shown in FIG. 10A to increase the amount of the process gas, the flow rate of the process gas is substantially uniform between the vicinities of the supporting pieces 64a to 64c and other areas. As a result, the thickness of the high-temperature oxide film can be made uniform between areas of the wafer W in the vicinities of the supporting pieces 64a to 64c and other areas.

In particular, since in the first embodiment, each of the supporting pieces 64a to 64c has the lower surface 68 tapered upward as shown in FIG. 10A to slightly increase the distance L2 between the tapered surface 68 and the wafer W placed on a ring member 63 directly below the tapered surface so as to increase the amount of the process gas flowing therebetween, the influence of the supporting pieces 64a to 64c can be further reduced.

As described above, in the film forming performed in the longitudinal heat treatment furnace 40 equipped with the wafer boat 60 of the first embodiment, variations in film thickness due to ununiform flow of the process gas can be avoided by virtue of the multiplier effect of the gas-restricting convex portions 66a to 66d and linear portion 65 and the cutouts 67a to 67c, which are formed at the ring member 63. Thus, the uniformity of the thickness of a film formed on the wafer W can be enhanced. Even in a case where one of the structure of the convex portions 66a to 66d and the linear portion 65 and the structure of the cutouts 67a to 67c is selected, the uniformity of wafer surface film thickness can be enhanced as compared with a case where none of the structures is selected. Accordingly, the case of selecting only one of the structures is included in the scope of the invention.

In particular, the provision of the tapered surfaces 68 to the supporting pieces 64a to 64c can further enhance the uniformity of wafer surface film thickness.

Although the amount of projection of the convex portions 66a to 66f or the amount of cut of the cutouts 67a to 67c is only several millimeters, they greatly influence the uniformity of wafer surface film thickness, i.e., in plane uniformity in film thickness. Where none of the convex portions 66a to 66f and the cutouts 67a to 67c is provided, the inplane uniformity in film thickness is about 4% at maximum. On the other hand, in the case of the wafer boat 60 of the first embodiment, the inplane uniformity can be increased to about 3%.

Figure 11:
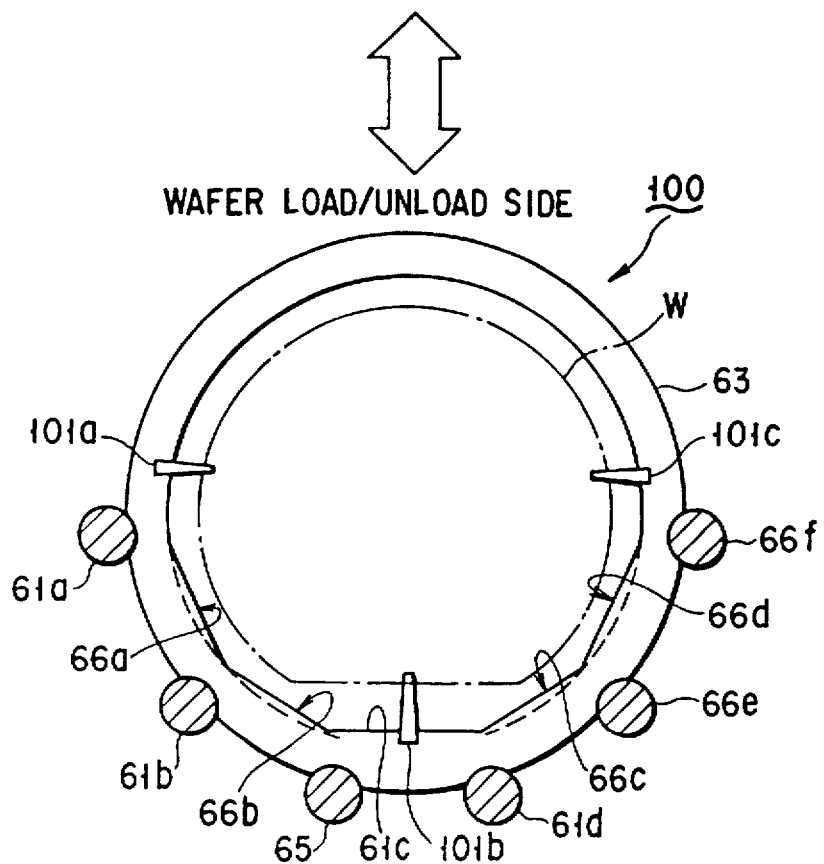
FIG. 11 is a transverse sectional view, showing a wafer boat according to a second embodiment.
Figure 12:
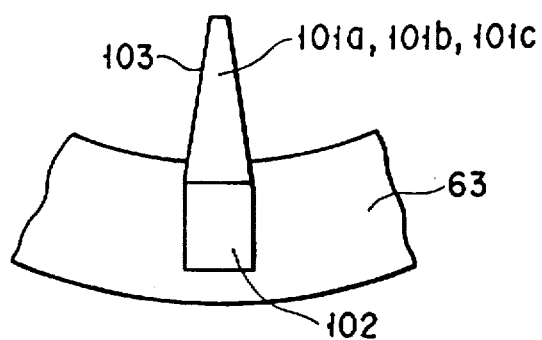
FIG. 12 is an enlarged perspective view, showing a supporting piece employed in the wafer boat of the second embodiment.

FIG. 11 is a transverse sectional view, showing an essential part of a wafer boat according to a second embodiment. In a wafer boat 100 according to the second embodiment, each of supporting pieces 101a to 101c provided on the upper surface of the ring member 63 has, as shown in FIG. 12, a projection 103 projecting from a rod 102 and having a cross section tapered in a direction away from the rod 102. In other words, the projection 103 has an upper surface of a trapezoidal shape. Since in this case, reduction of the flow of the process gas by the supporting pieces 101a to 101c can be restricted as compared with the boat wafer 60 of the first embodiment, the inplane uniformity in film thickness can be further enhanced.

Descriptions will now be given of experiments made for estimating the inplane uniformity of the thickness of a film formed using the wafer boat of the invention. In the experiments, a wafer boat as a comparative and wafer boats as examples 1 and 2, which will be described below, were prepared.

Figure 13A:
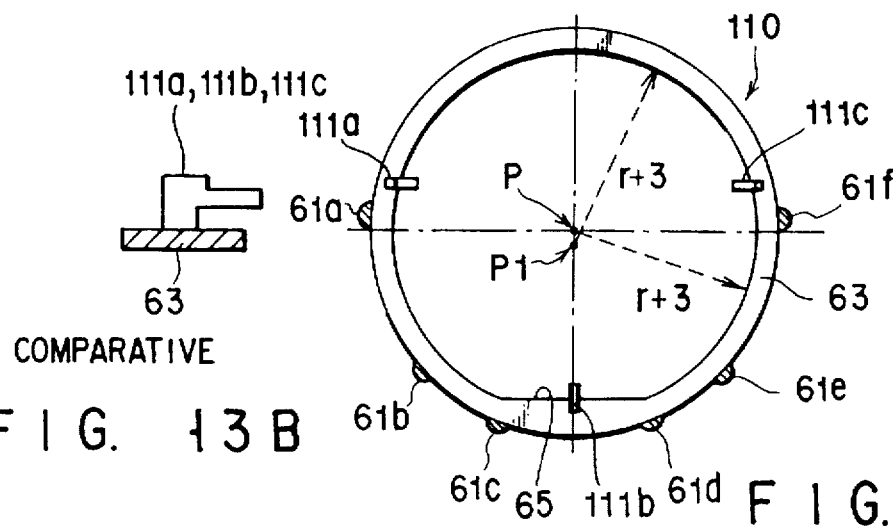
FIG. 13A is a transverse sectional view, showing a comparative wafer boat.

FIGS. 13A and 13B show a comparative wafer boat 110. As is shown in FIG. 13A, in the wafer boat 110, the inner peripheral edge of the ring member 63 has the linear portion 65 only and no convex portions. Further, as is shown in FIG. 13B, supporting pieces 111a, 111b and 111c have no tapered lower surfaces. The ring member 63 has no cutouts in portions thereof located below the supporting pieces 111a, 111b and 111c.

Figure 14A:
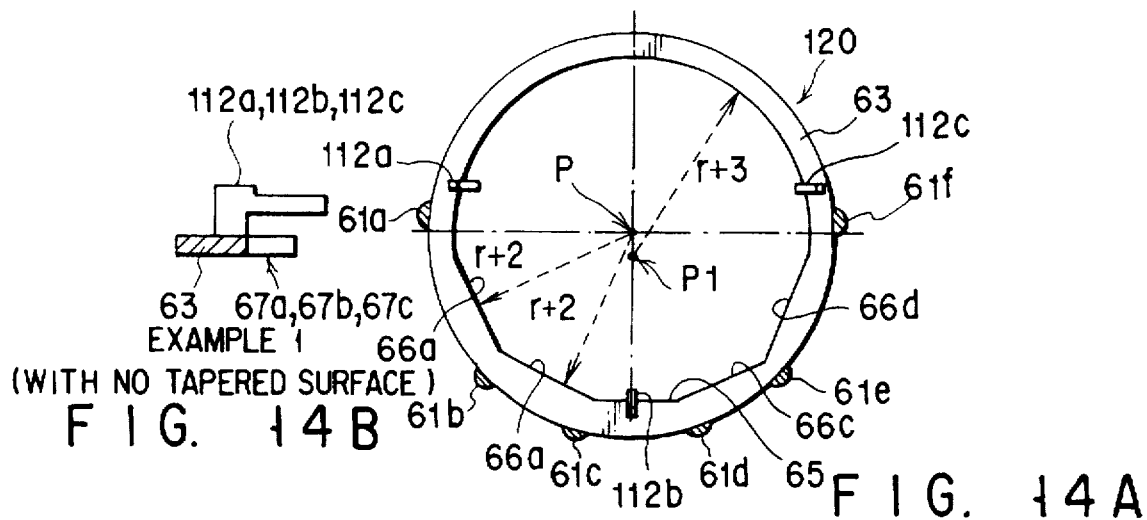
FIG. 14A is a transverse sectional view, showing the wafer boat of the first embodiment.

On the other hand, in a wafer boat 120 as example 1 shown in FIG. 14A, the inner peripheral edge of the ring member 63 has the linear portion 65 and the convex portions 66a to 66d between the rods 61a to 61f. Further, as is shown in FIG. 14B, supporting pieces 112a to 112c have no tapered lower surfaces, and the ring member 63 has cutouts 67a to 67c formed in portions thereof located below the pieces 112a to 112c.

Figure 15A:
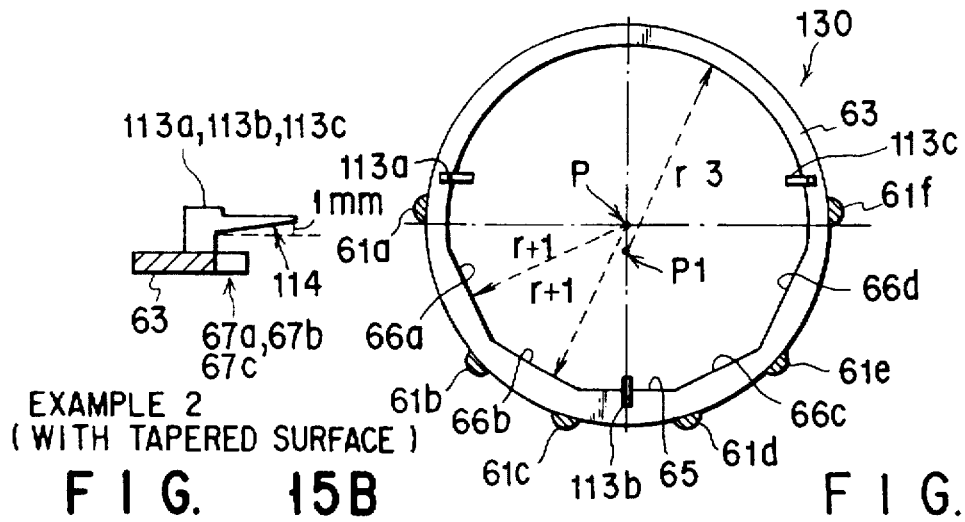
FIG. 15A a transverse sectional view, showing the wafer boat of the second embodiment.

Further, in a wafer boat 130 as example 2 shown in FIG. 15A, the inner peripheral edge of the ring member 63 has the linear portion 65 and the convex portions 66a to 66d between the rods 61a to 61f. Further, as is shown in FIG. 15B, supporting pieces 113a to 113c have tapered lower surfaces 114, and the ring member 63 has cutouts 67a to 67c formed in portions thereof located below the pieces 113a to 113c.

In the wafer boat 110 as the comparative and the wafer boats 120 and 130 as examples 1 and 2, the reference radius of the circular space defined by the inner peripheral edge of the ring member 63 is set to r mm. As is shown in FIGS. 14A and 15A, in each of examples 1 and 2, the radius of the space defined by the inner peripheral edge is partially varied by a few millimeters. Moreover, in all of the comparative and examples 1 and 2, the amount of deviation of points P and P1 is set to 2 mm, and the width of the ring member 63 is set to 10 mm. Each of the wafer boats 110, 120 and 130 includes 64 ring members 63.

Each of the wafer boats 110, 120 and 130 as the comparative and examples 1 and 2 was transferred into the longitudinal heat treatment furnace 40 with 56 wafers W contained therein, thereby forming a high-temperature oxide film on each wafer.

Concerning each of the wafer boats 110, 120 and 130, the thicknesses of 121 portions of a high-temperature oxide film formed on each of a $12^{th}$ wafer from the top (hereinafter referred to as "TOP"), a $30^{th}$ wafer from the top (hereinafter referred to as "CRT"), a $56^{th}$ wafer from the top (hereinafter referred to as "BTM") and the other wafers were measured. From the measurement results, the inplane uniformity in film thickness of each wafer was calculated. The calculation results are shown in table 1 below and FIG. 16.

TABLE 1

| | INPLANE UNIFORMITY | | |
|---|---|---|---|
| | COMPARATIVE | EXAMPLE 1 | EXAMPLE 2 |
| TOP ($12^{th}$ WAFER) | ±4.08% | ±2.86% | ±2.48% |
| CTR ($30^{th}$ WAFER) | ±3.66% | ±2.75% | ±2.00% |
| BTM ($56^{th}$ WAFER) | ±3.22% | ±2.64% | ±2.13% |
| ALL OVER | ±5.01% | ±3.65% | ±2.96% |

As is evident from table 1 and FIG. 16, the inplane uniformity was as bad as about 3 to 4% in the case of using the wafer boat 110 as the comparative. On the other hand, the inplane uniformity was as good as 3% or less in the case of using the wafer boats 120 and 130 as examples 1 and 2. In particular, it was confirmed that the wafer boat 130 as example 2 which employs the tapered surface 114 can provide more excellent inplane uniformity than the wafer boat 120 as example 1 which employs no tapered surface.

FIG. 17A is a transverse sectional view, showing a wafer boat 140 according to a third embodiment of the invention, and FIG. 17B is a longitudinal sectional view, showing an essential part of the wafer boat 140 of the third embodiment. As is shown in FIG. 17A, in the wafer boat 140 of the third embodiment, the ring member 63 has no convex portions at its inner peripheral edge, but has cutouts 67a to 67c formed in portions thereof located below supporting pieces 115a to 115c with no tapered surfaces. In the other part of the structure, the wafer boat 140 is similar to the wafer boat 60 of the first embodiment.

The wafer boat 140 of the third embodiment was subjected to experiments similar to the above. The wafer boat 140 differs from the comparative wafer boat 110 as follows:

In the case of using the comparative wafer boat 110 with no cutouts, the high-temperature oxide film has a thickness of 98.65 nm at a center portion of the wafer W, and 98.65 nm and 100.55 nm at portions of the wafer in the vicinities of the supporting pieces 112a to 112c. Thus, there was a difference of 1.90 nm at maximum.

On the other hand, in the case of using the wafer boat 140 of the third embodiment, the high-temperature oxide film has a thickness of 98.65 nm at a center portion of the wafer W, and 97.4 nm and 99.45 nm at portions of the wafer in the vicinities of the supporting pieces 112a to 112c. Thus, there was a difference of 1.24 nm at maximum, which is greatly lower than in the case of the comparative. It was confirmed from the results of comparison that the wafer boat 140 of the third embodiment which employs only the cutouts 67a to 67c can provide high inplane uniformity in film thickness as in the case of examples 1 and 2, although the degree of inplane uniformity is relatively low.

FIG. 18A is a transverse sectional view, showing a wafer boat 150 according to a fourth embodiment of the invention, and FIG. 18B is a longitudinal sectional view, showing an essential part of the wafer boat 150 of the fourth embodiment. As is shown in FIG. 18A, the ring member 63 has the convex portions 66a to 66d at its inner peripheral edge as in the first embodiment, but does not have any cutouts 67a to 67c in portions thereof located below supporting pieces 116a to 116c. Further, the supporting pieces 116a to 116c have no tapered lower surfaces. In the other part of the structure, the wafer boat 150 is similar to the wafer boat 60 of the first embodiment. The wafer boat 150 with only the convex portions 66a to 66d can also enhance the inplane uniformity in film thickness by restraining the flow rate of the process gas with the convex portions 66a to 66d.

Although in the above embodiments, descriptions have been given of inplane uniformity in the case of forming a high-temperature oxide film, the invention is not limited to this. The wafer boat of the invention is applicable to an improvement in inplane uniformity of the thickness of any kind of film. Furthermore, the invention is also applicable to an improvement in inplane uniformity in a heat treatment using a process gas such as annealing or thermal diffusion treatment, as well as the film forming treatment.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A wafer boat for simultaneously supporting a plurality of semiconductor wafers, comprising:

a plurality of rods arranged substantially parallel to each other at regular intervals;

a plurality of ring members attached to the rods at regular intervals in a longitudinal direction of the rods, each of the ring members having a diameter larger than the diameter of a corresponding wafer;

a plurality of supporting pieces attached to each of the ring members, each of the supporting pieces extending upward from an upper surface portion of each of the ring members and extending radially inward of the ring member, the supporting pieces of each of the ring members being brought into contact with an edge portions of a lower surface of the wafer to support the wafer; and a plurality of convex portions formed at inner peripheral edge portions of each of the ring members between each pair of adjacent ones of the rods, and extending radially inward of the ring member.

2. The wafer boat according to claim 1, further comprising a plurality of cutouts respectively formed in those portions of each of the ring members which are located below the supporting pieces.

3. The wafer boat according to claim 2, wherein each of the supporting pieces has a tapered lower surface tapered upward and radially inward of the ring member.

4. The wafer boat according to claim 2 or 3, wherein each of the supporting pieces has an upper surface of a trapezoidal shape.

5. The wafer boat according to claim 1, wherein the amount of extension of each of the convex portions is 2 mm or less when the wafer has a diameter of 8 inches.

6. The wafer boat according to claim 1, wherein the amount of extension of each of the convex portions is 3 mm or less when the wafer has a diameter of 12 inches.

7. The wafer boat according to claim 1, wherein all the rods are attached to a substantially half portion of the outer peripheral edge portion of each of the ring members, and each wafer is transferred onto and from a corresponding one of the ring members, being passed on the side of the other half portion of the outer peripheral edge portion of the ring member.

8. A wafer boat for simultaneously supporting a plurality of semiconductor wafers, comprising:

a plurality of rods arranged substantially parallel to each other at regular intervals;

a plurality of ring members attached to the rods at regular intervals in a longitudinal direction of the rods, each of the ring members having a diameter larger than the diameter of a corresponding wafer;

a plurality of supporting pieces attached to each of the ring members, each of the supporting pieces extending upward from an upper surface portion of each of the ring members and extending radially inward of the ring member, the supporting pieces of each of the ring members being brought into contact with an edge portions of a lower surface of the wafer to support the wafer; and a plurality of cutouts respectively formed in those portions of each of the ring members which are located below the supporting pieces.

9. The wafer boat according to claim 8, wherein each of the supporting pieces has a tapered lower surface tapered upward and radially inward of the ring member.

10. The wafer boat according to claim 8 or 9, wherein each of the supporting pieces has an upper surface of a trapezoidal shape.

11. The wafer boat according to claim 8, further comprising a plurality of convex portions formed at inner peripheral edge portions of each of the ring members between each pair of adjacent ones of the rods, and extending radially inward of the ring member.

12. The wafer boat according to claim 11, wherein the amount of extension of each of the convex portions is 2 mm or less when the wafer has a diameter of 8 inches.

13. The wafer boat according to claim 11, wherein the amount of extension of each of the convex portions is 3 mm or less when the wafer has a diameter of 12 inches.

14. The wafer boat according to claim 8, wherein all the rods are attached to a substantially half portion of the outer peripheral edge of each of the ring members, and each wafer is transferred onto and from a corresponding one of the ring members, being passed on the side of the other half portion of the outer peripheral edge of the ring member.

* * * * *